United States Patent
Misischi

(10) Patent No.: US 11,757,611 B2
(45) Date of Patent: Sep. 12, 2023

(54) PAM4 THRESHOLD PHASE ENGINE

(71) Applicant: Litrinium, Inc., Aliso Viejo, CA (US)

(72) Inventor: Bertrand Misischi, Vallauris (FR)

(73) Assignee: Litrinium, Inc., Mission Viejo, CA (US)

( * ) Notice: Subject to any disclaimer, the term of this patent is extended or adjusted under 35 U.S.C. 154(b) by 0 days.

(21) Appl. No.: 17/227,330

(22) Filed: Apr. 11, 2021

(65) Prior Publication Data

US 2022/0329404 A1 Oct. 13, 2022

(51) Int. Cl.
*H04L 7/00* (2006.01)
*H04L 25/49* (2006.01)
*H03K 5/08* (2006.01)

(52) U.S. Cl.
CPC .......... *H04L 7/0016* (2013.01); *H03K 5/082* (2013.01); *H04L 25/4917* (2013.01)

(58) Field of Classification Search
CPC ....... H04L 25/4917; H04L 2025/03363; H04L 25/03006; H04L 7/0016; H03K 5/082; H03K 9/02
See application file for complete search history.

(56) References Cited

U.S. PATENT DOCUMENTS

| | | | |
|---|---|---|---|
| 7,792,481 B2 | 9/2010 | Dederer | |
| 9,071,481 B2 | 6/2015 | Kaviani | |
| 9,317,353 B2 | 4/2016 | Ravi | |
| 9,843,309 B2 | 12/2017 | Zerbe | |
| 9,998,305 B2 | 6/2018 | Zerbe | |
| 10,250,418 B2* | 4/2019 | Kyles | H04L 25/0272 |
| 10,476,716 B2* | 11/2019 | Li | H04L 1/205 |
| 2015/0201052 A1 | 7/2015 | Li | |
| 2018/0159514 A1 | 6/2018 | Zerbe | |
| 2020/0066309 A1 | 2/2020 | Mayer | |
| 2022/0209998 A1* | 6/2022 | Kim | H04L 25/4917 |

* cited by examiner

*Primary Examiner* — Betsy Deppe
(74) *Attorney, Agent, or Firm* — Joseph A. Andelin; Fish IP Law, LLP

(57) ABSTRACT

A PAM4 signal processor calibrates slicing thresholds to reduce bit error rate in a PAM4 clock data recovery circuit by determining a first target value of a first slicing level. The PAM4 signal processor is configured to retrieve the first target value of the first slicing level and sweeps a first reference voltage down from the upper voltage threshold. The PAM4 signal processor is further configured to detect a first filtered output associated with the first reference voltage and determines whether the first filtered output is higher than a target value. Responsive to determining that the first filtered output is higher than the target value, the PAM4 signal processor stores the first reference voltage value.

2 Claims, 12 Drawing Sheets

Slicing Level Adaptation

Phase Adaptation

PAM4 THRESHOLD PHASE ENGINE

FIELD OF THE INVENTION

The field of the invention is signal processing.

BACKGROUND

The inventive concepts herein aim to calibrate PAM4 signals using a monitoring pathway to reduce intersymbol interference and cancel noise.

Specifically, the present invention provides a monitoring pathway to sample an output signal, determine whether the number of "00"s, "01"s, "11"s and "10"s are correctly represented in a resulting analog output signal. By determining the amount of phase offset and the voltage offset associated with the signal, the monitoring pathway can apply positive and/or negative offsets to at least one of a phase and/or a voltage applied to a PAM4 signal. By applying this offset using a separate monitoring pathway, the present invention allows for automatic and continuous adaptation of a PAM4 signal without disrupting the flow of data. As such, the adjustment in voltage slicing and phase reduces bit error rate by reducing noise in the PAM4 signal and more clearly defining the "eyes" in a PAM4 signal waveform.

In short, the methods and systems described herein create an auto-adaptive loop that independently finds the optimum slicing thresholds for each level of a PAM4 signal.

In conventional systems, calibration is achieved by running a series of test signals and comparing the output signals to the correct output. As computing power grows exponentially, however, such systems and methods introduce inefficiencies into the system by using the same conduits for data transmission for calibration. By separating the calibration means from the data transmission means, the data transmission is unimpeded and calibration is performed on an ongoing basis. As such, the present invention provides the additional benefit of being able to calibrate PAM4 signals in substantially real-time, which can automatically account for any changes to overall system causing increased ISI.

It is contemplated the invention described herein anticipates the technical challenges presented by changing computing landscape, which increasingly prioritizes system efficiency to provide seamless user experiences.

U.S. Pat. No. 9,071,481 B2 to Kaviani teaches a system for compensating for ISI by running a calibration signal through a circuit under calibration. The output signal is then compared to a predetermined pattern to determine the offset for the circuit being calibrated.

U.S. Pat. No. 7,792,481 B2 to Bulzacchelli teaches a hardware system that includes summer circuits to add dynamic feedback signals representing a dynamic feedback tap to a received input in order to speculate on a speculative tap.

Javiani, Bulzacchelli, and all other extrinsic materials discussed herein are incorporated by reference to the same extent as if each individual extrinsic material was specifically and individually indicated to be incorporated by reference. Where a definition or use of a term in an incorporated reference is inconsistent or contrary to the definition of that term provided herein, the definition of that term provided herein applies and the definition of that term in the reference does not apply.

Thus, there is still a need for processing systems that are uniquely adapted to increase data transmission bandwidth and data transmission accuracy by using a separate monitoring pathway to calculate signal offset.

SUMMARY OF THE INVENTION

The inventive concept herein contemplates virtual reality, augmented reality, and/or mixed reality environments that are highly customizable with various interactive elements. It is contemplated that the interactive elements can be at least partially customized by a task module associated with one or more mixed reality spaces. It is further contemplated that the task module can analyze the context of a user's environment using a combination of data sources and alter any one or more of a user's environment, avatar, and sensory effects (e.g., visual, olfactory, and auditory effects) accordingly.

The present invention contemplates that a PAM4 signal processor calibrates slicing thresholds to reduce bit error rate in a PAM4 clock data recovery circuit by determining a first target value of a first slicing level. The PAM4 signal processor retrieves the first target value of the first slicing level and sweeps a first reference voltage down from the upper voltage threshold. The PAM4 signal processor detects a first filtered output associated with the first reference voltage and determines whether the first filtered output is higher than a target value. Responsive to determining that the first filtered output is higher than the target value, the PAM4 signal processor stores the first reference voltage value.

Various resources, features, aspects and advantages of the inventive subject matter will become more apparent from the following detailed description of preferred embodiments, along with the accompanying drawing figures in which like numerals represent like components.

DETAILED DESCRIPTION

It should be noted that while the following description is drawn to a computer-based scheduling system, various alternative configurations are also deemed suitable and may employ various computing devices including servers, interfaces, systems, databases, engines, controllers, or other types of computing devices operating individually or collectively. One should appreciate the computing devices comprise a processor configured to execute software instructions stored on a tangible, non-transitory computer-readable storage medium (e.g., hard drive, solid state drive, RAM, flash, ROM, etc.). The software instructions preferably configure the computing device to provide the roles, responsibilities, or other functionality as discussed below with respect to the disclose apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network.

One should appreciate that the disclosed techniques provide many advantageous technical effects including increased data throughput and accuracy in high-speed circuitry.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
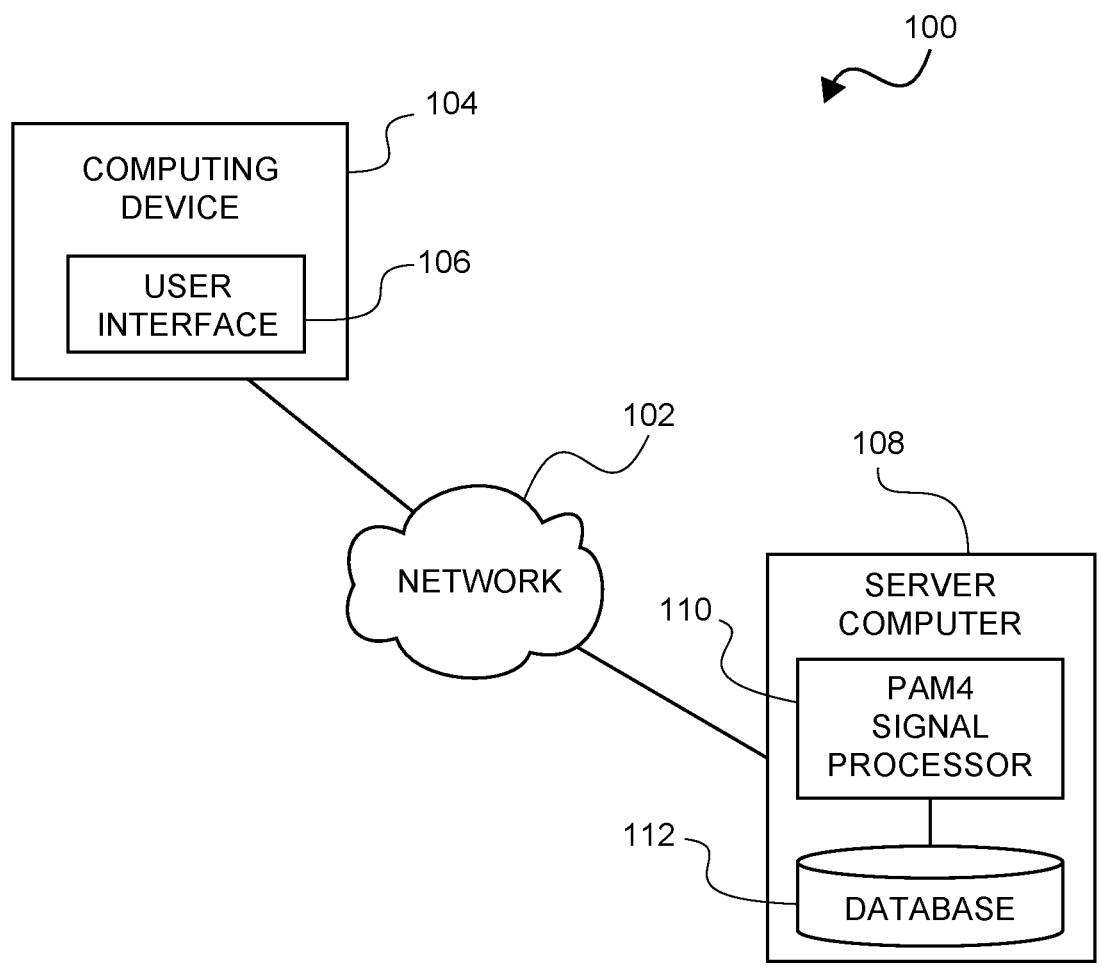
FIG. 1 is a functional block diagram illustrating a distributed data processing environment.

FIG. 1 is a functional block diagram illustrating a distributed data processing environment.

The term "distributed" as used herein describes a computer system that includes multiple, physically distinct devices that operate together as a single computer system. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes computing device 104 and server computer 108, interconnected over network 102. Network 102 can include, for example, a telecommunications network, a local area network (LAN), a wide area network (WAN), such as the Internet, or a combination of the three, and can include wired, wireless, or fiber optic connections. Network 102 can include one or more wired and/or wireless networks that are capable of receiving and transmitting data, voice, and/or video signals, including multimedia signals that include voice, data, and video information. In general, network 102 can be any combination of connections and protocols that will support communications between computing device 104, server computer 108, and any other computing devices (not shown) within distributed data processing environment 100.

It is contemplated that computing device 104 can be any programmable electronic computing device capable of communicating with various components and devices within distributed data processing environment 100, via network 102. It is further contemplated that computing device 104 can execute machine-readable program instructions and communicate with any devices capable of communication wirelessly and/or through a wired connection. Computing device 104 includes an instance of user interface 106.

User interface 106 provides a user interface to PAM4 signal processor 110. Preferably, user interface 106 comprises a graphical user interface (GUI) or a web user interface (WUI) that can display one or more of text, documents, web browser windows, user option, application interfaces, and operational instructions. It is also contemplated that user interface can include information, such as, for example, graphics, texts, and sounds that a program presents to a user and the control sequences that allow a user to control a program.

In some embodiments, user interface can be mobile application software. Mobile application software, or an "app," is a computer program designed to run on smart phones, tablet computers, and any other mobile devices.

Server computer 108 can be a standalone computing device, a management server, a web server, a mobile computing device, or any other computing system capable of receiving, sending, and processing data.

It is contemplated that server computer 108 can include a server computing system that utilizes multiple computers as a server system, such as, for example, a cloud computing system.

In other embodiments, server computer 108 can be a computer system utilizing clustered computers and components that act as a single pool of seamless resources when accessed within distributed data processing environment 100.

Database 112 is a repository for data used by PAM4 signal processor 110. In the depicted embodiment, PAM4 signal processor 110 resides on server computer 108. However, database 112 can reside anywhere within a distributed data processing environment provided that PAM4 signal processor 110 has access to database 112.

Data storage can be implemented with any type of data storage device capable of storing data and configuration files that can be accessed and utilized by server computer 108. Data storage devices can include, but are not limited to, database servers, hard disk drives, flash memory, and any combination thereof.

Figure 2A:
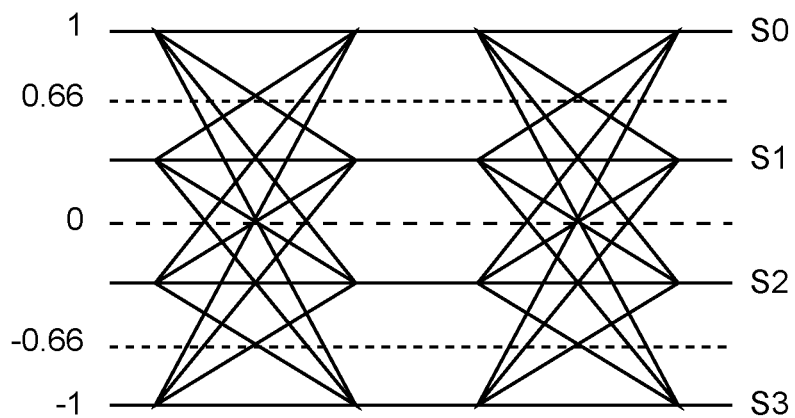
FIG. 2A is a diagram illustrating the equiprobability of each level of a PAM4 signal as depicted through an isolated portion of a PAM4 signal waveform.

FIG. 2A is a diagram illustrating the equiprobability of each level of a PAM4 signal.

Pulse amplitude modulation 4-level ("PAM4") signals are built such that each of four probabilities associated with four respective voltage levels are equally likely to occur. PAM4 doubles the number of bits in serial data transmissions. However, PAM4 signals come with the drawback of noise susceptibility. As each voltage level in non-return-to-zero (NRZ signals), like PAM4 signals, create a smaller eye in and eye diagram, the bit-error-rate at the receiving end of the link is tied to the available level of granularity in interpreting the signal.

Figure 2B:
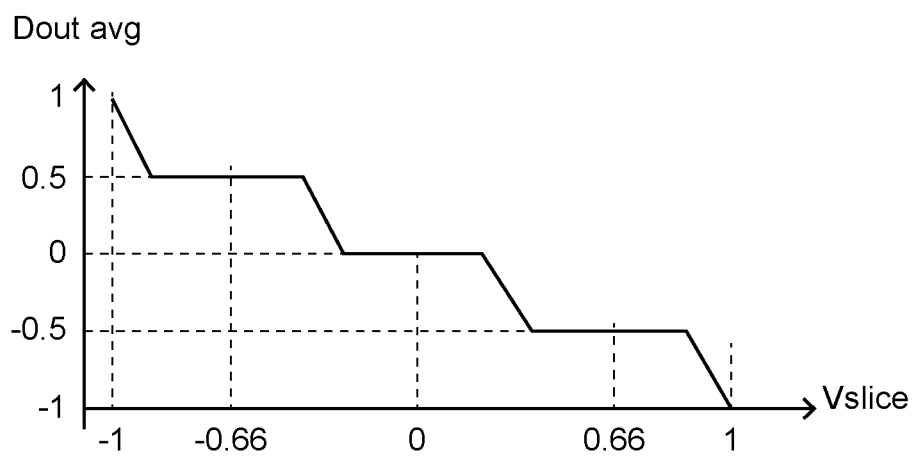
FIG. 2B is a diagram illustrating the average levels of a PAM4 signal as sliced values.

FIG. 2B is a diagram illustrating the average levels of a PAM4 signal as sliced values. The x axis represents the reference voltage of the slicer (Vslice) and the y axis represents the average digital voltage at the output of the flip flop (Dout_avg).

Figure 3:
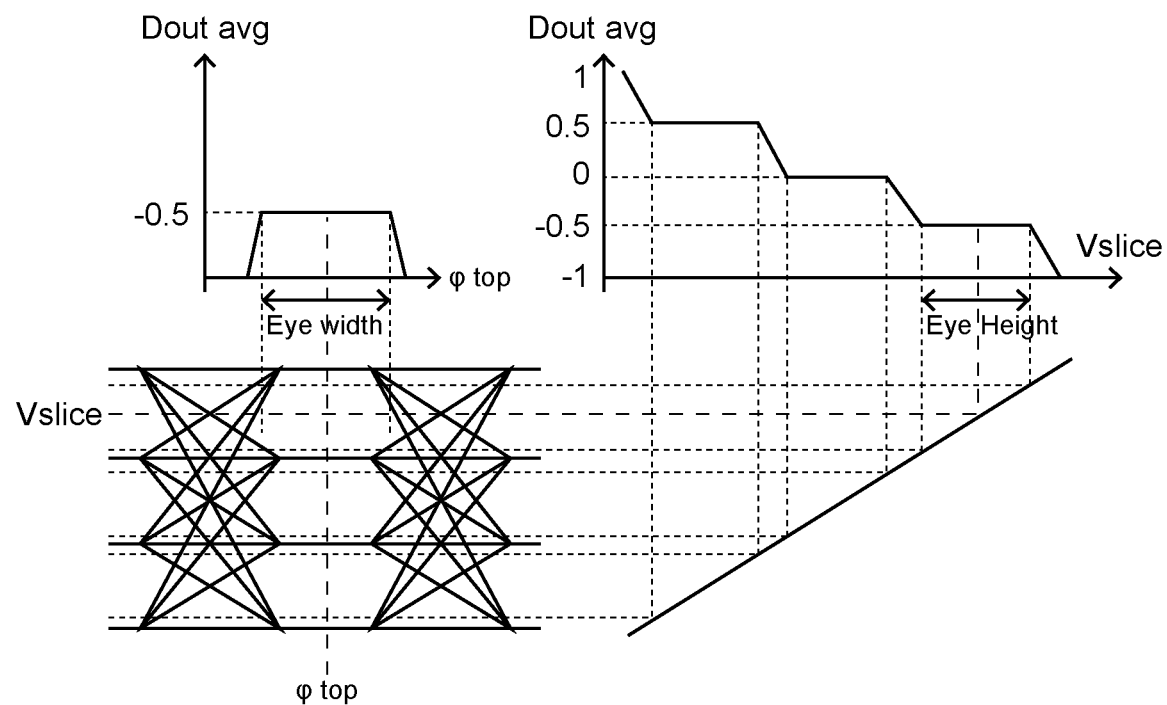
FIG. 3 is a schematic illustrating the relative relationship between FIGS. 2A and 2B to determine average digital output average values for a slicing level and phase.

FIG. 3 is a schematic illustrating the relative relationship between FIGS. 2A and 2B to determine average digital voltage output average values (Dout_avg) for a slicing level and a clock phase of the top path (φ_top).

Figure 4:
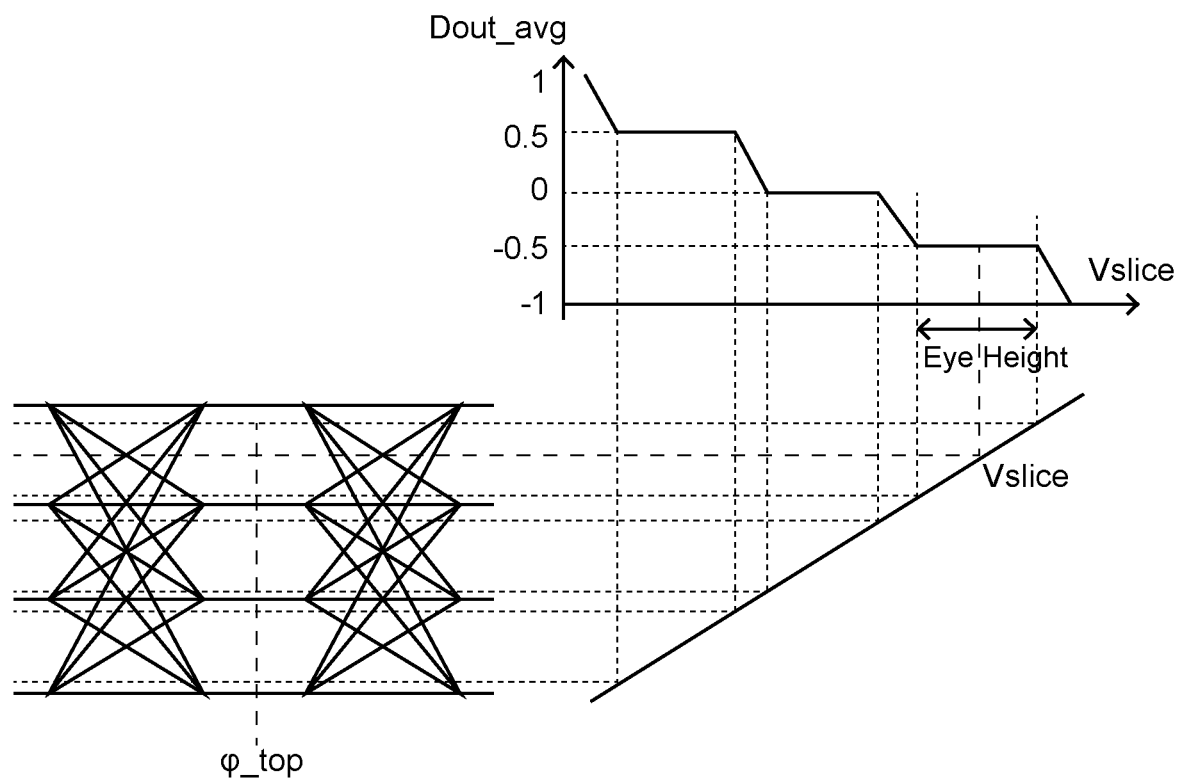
FIG. 4 is a schematic illustrating the relative relationship between FIGS. 2A and 2B to determine an eye height for average digital output average values for a reference voltage.

FIG. 4 is a schematic illustrating the relative relationship between FIGS. 2A and 2B to determine an eye height for average digital output average values (Dout_avg) for a given slicing level voltage (Vslice).

Figure 5:
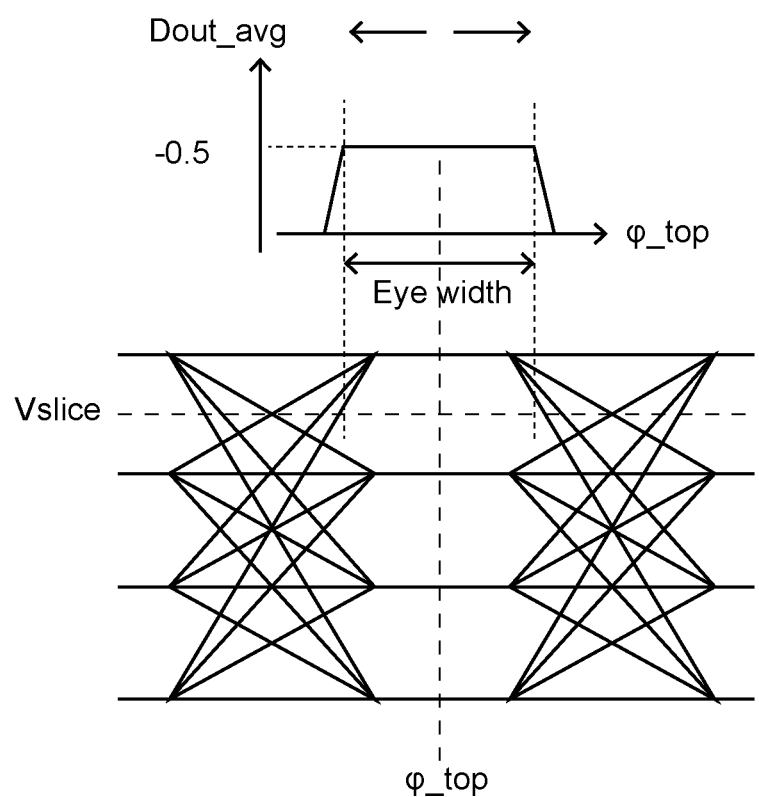
FIG. 5 is a schematic illustrating a method of determining an eye width according to average digital output values for a given slicing level.

FIG. 5 is a schematic illustrating a technique for determining an eye width according to average digital output values (Dout_avg) for a given slicing level voltage (Vslice).

Figure 6:
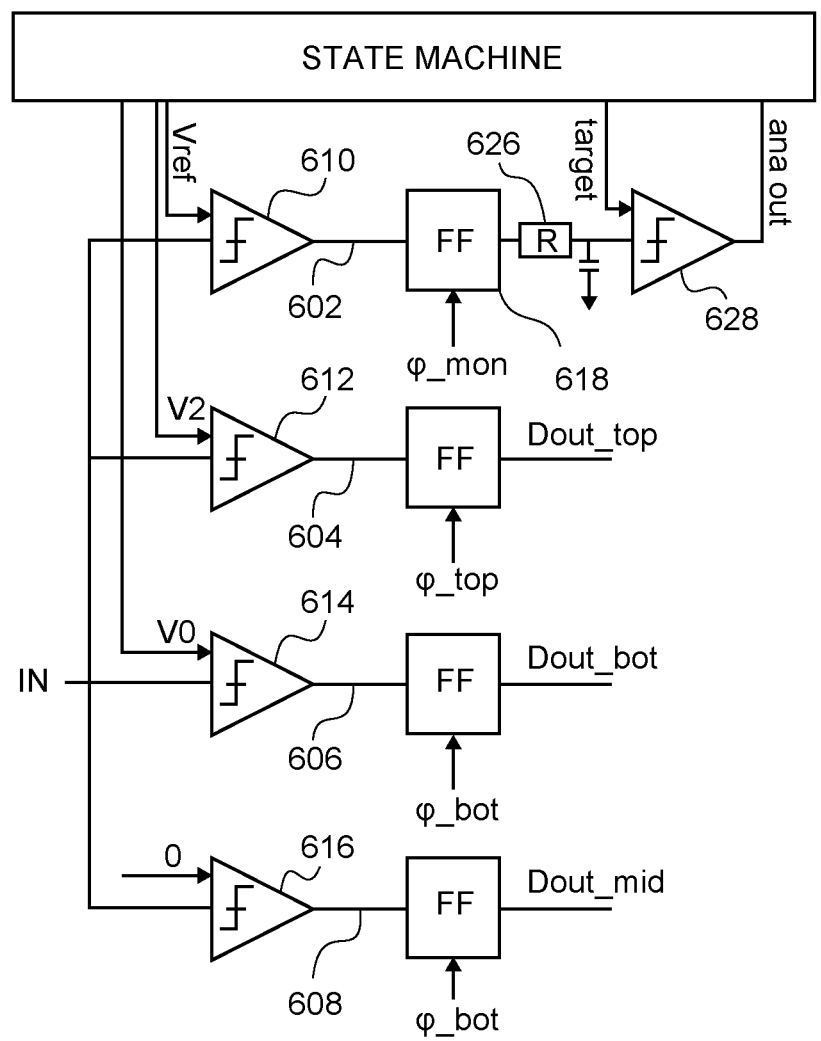
FIG. 6 is schematic showing a multi-level slicer pathway with a monitor pathway configured to determine one or more slicing levels and one or more phases without disturbing data transfer.

FIG. 6 is schematic showing a multi-level slicing pathways with a monitor pathway configured to determine one or more slicing levels without disturbing data transfer.

Monitor pathway 602 is a first slicing pathway that is configured to determine a top slicing level associated with a top pathway 604 and a bottom slicing level associated with a bottom pathway 606. Monitor pathway 602 includes monitor comparator 610, a first flip-flop 618 (i.e., latch) associated with a monitoring phase (e.g., (i) mon), resistor 626, and second monitor comparator 628. Monitor pathway 602 filters the digital output into an analog output. Monitor 602 then determines whether the analog output (e.g., ana_out) matches a target output (e.g., target).

Top pathway 604 is associated with a top pathway reference voltage (V2) and includes a second comparator 612. Bottom pathway 606 is associated with a bottom pathway reference voltage (V0) and includes a third comparator 614.

Middle pathway 608 is associated with a middle pathway reference voltage (0) and includes a fourth comparator 616. As a voltage of 0 is associated with direct current balance, PAM4 signal processor 110 sets the middle pathway reference voltage at a value of 0.

The methods and systems used to determine voltage slicing levels based on respective reference voltages are discussed in further detail below.

Figure 7:
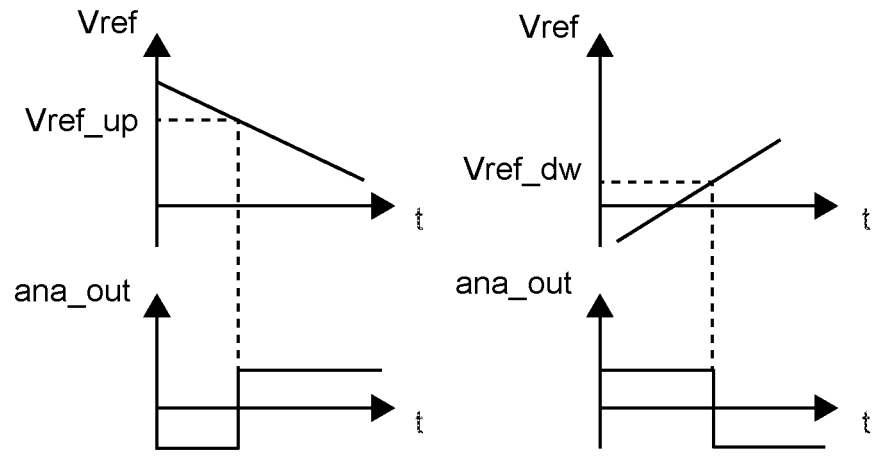
FIG. 7 is an illustration depicting the sweeping of average output monitor voltage to determine an optimum reference voltage threshold value and an optimum phase.
Figure 7:
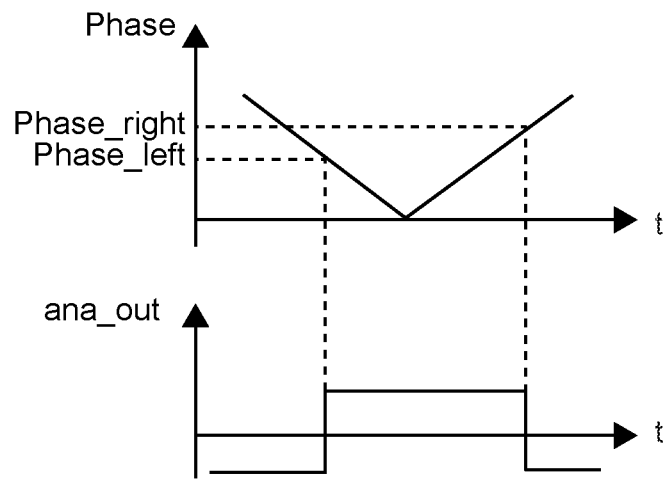

FIG. 7 is an illustration depicting the sweeping of voltages and phases to determine an optimum reference voltage threshold value and an optimum phase.

The slicing level adaptation is shown in a representative figure depicting the calibration of a slicing level by averaging a first reference voltage value (Vref_up) resulting from a down sweep from a reference voltage (Vref) and a second reference voltage value (Verf_dw) resulting from an up sweep to a reference voltage (Vref). The average of the first and second reference voltage values results in the optimum reference voltage threshold, which corresponds to the correct analog output (e.g., ana_out).

The optimum phase adaptation is shown in a representative figure depicting the calibration of the correct phase associated with the correct analog output. PAM4 signal processor 110 moves phase_right from left to right until the correct analog output is achieved. PAM4 signal processor 110 also moves phase_left from the right to the left until the correct analog output is achieved. Using the calibrated phase_right value and the calibrated phase_left value, PAM4 signal processor 110 calculates an optimum phase.

Figure 8:
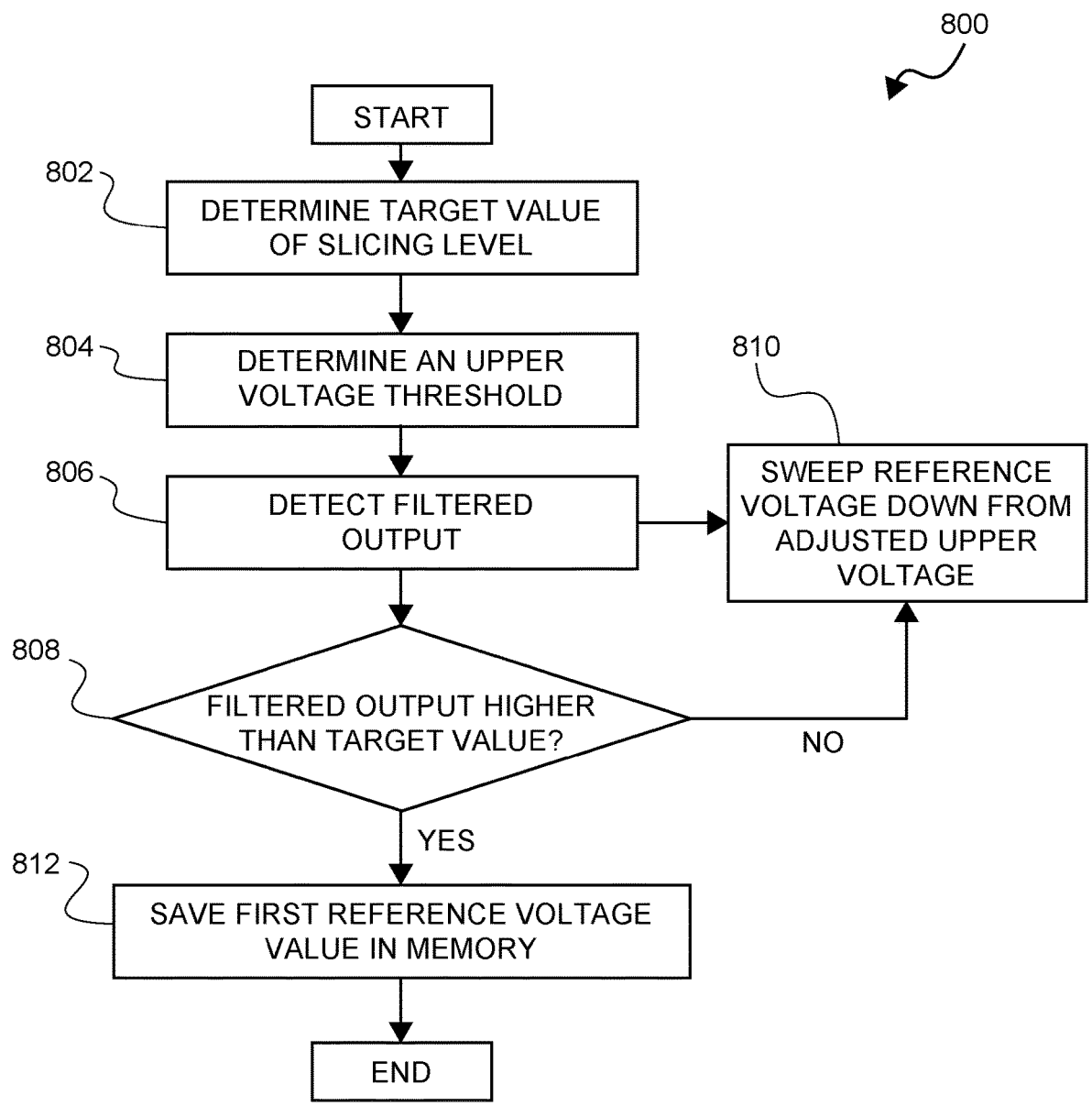
FIG. 8 is a schematic of a method of determining an upper reference voltage threshold value.

FIG. 8 is a schematic of a method of determining an upper reference voltage threshold value for a slicing level.

PAM4 signal processor 110 determines a target value of a reference voltage (step 802).

The target value for a reference voltage is determined by the theoretical digital output value for the reference voltage. For example, as depicted in FIG. 2B the theoretical slicing value for the middle pathway reference voltage is 0.

PAM4 signal processor 110 determines an upper voltage threshold (step 804).

PAM4 signal processor 110 uses monitoring pathway 602 to sweep the voltage down from an upper threshold filtered through monitor pathway 602 until the correct analog output is achieved. The resulting upper voltage value is saved in memory and may be set as the upper voltage value at a later time The upper voltage threshold can be determined in any manner known in the art. The upper voltage threshold is contemplated to result in a digital output value that is higher than the theoretical digital output value for the associated reference voltage.

PAM4 signal processor 110 detects a filtered output (step 806).

PAM4 signal processor 110 determines whether the filtered output is higher than the target value (decision block 808).

Responsive to determining that the filtered output is higher than the target value ("YES" branch, decision block 808), PAM4 signal processor 110 saves a first reference voltage value associated with the filtered output in memory (step 812) and ends.

Responsive to determining that the filtered output is not higher than the target value ("NO" branch, decision block 812), PAM4 signal processor 110 sweeps a reference voltage down from the upper voltage threshold (step 810) and returns to detect the filtered output (step 806).

By sweeping the voltage down from the upper threshold until the resulting theoretical digital output value is achieved, PAM4 signal processor 110 can determine a point at which the filtered output is higher than the target value.

PAM4 signal processor 110 saves a first reference voltage value in memory (step 812).

Figure 9:
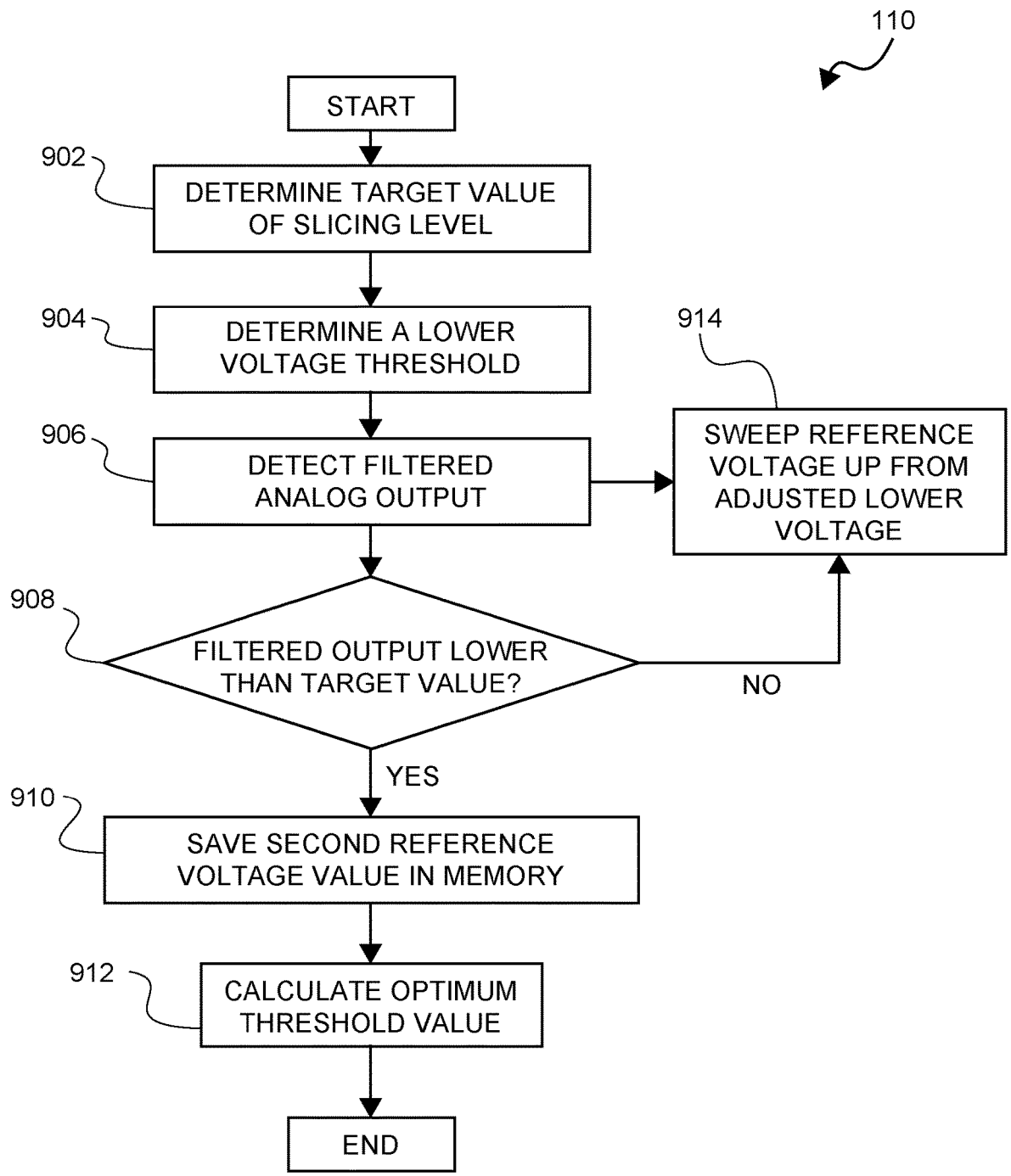
FIG. 9 is a schematic of a method of determining a lower reference voltage threshold value.

FIG. 9 is a schematic of a method of determining a lower reference voltage threshold value.

PAM4 signal processor 110 determines a target value of a slicing level (step 902).

The target value for a reference voltage is determined by the theoretical digital output value for the reference voltage. For example, as depicted in FIG. 2B the theoretical slicing value for the middle pathway reference voltage is 0.

PAM4 signal processor 110 determines a lower voltage threshold (step 904).

PAM4 signal processor 110 uses monitoring pathway 602 to sweep the voltage up from a lower threshold filtered through monitor pathway 602 until the correct analog output is achieved. The resulting lower voltage value is saved in memory.

The lower voltage threshold can be determined in any manner known in the art. The lower voltage threshold is contemplated to result in a digital output value that is lower than the theoretical digital output value for the associated reference voltage.

PAM4 signal processor 110 detects a filtered output signal (step 906).

PAM4 signal processor 110 determines whether the filtered output is lower than the target value (decision block 908).

Responsive to determining that the filtered output is not higher than the target value ("NO" branch, decision block 908), PAM4 signal processor 110 sweeps a reference voltage down from a lower voltage (step 914) and detects a filtered analog output (step 906).

By sweeping the voltage up from the lower threshold until the resulting theoretical digital output value for the respective reference voltage is achieved, PAM4 signal processor 110 can determine a point at which the filtered output is lower than the target value.

Responsive to determining that the filtered output is lower than the target value ("YES" branch, decision block 908), PAM4 signal processor 110 saves a second reference voltage value associated with the filtered output in memory (step 910).

PAM4 signal processor 110 calculates an optimum threshold value (step 912).

In a preferred embodiment, PAM4 signal processor 110 averages the first reference voltage value and the second reference voltage value to determine an optimum threshold value.

Figure 10:
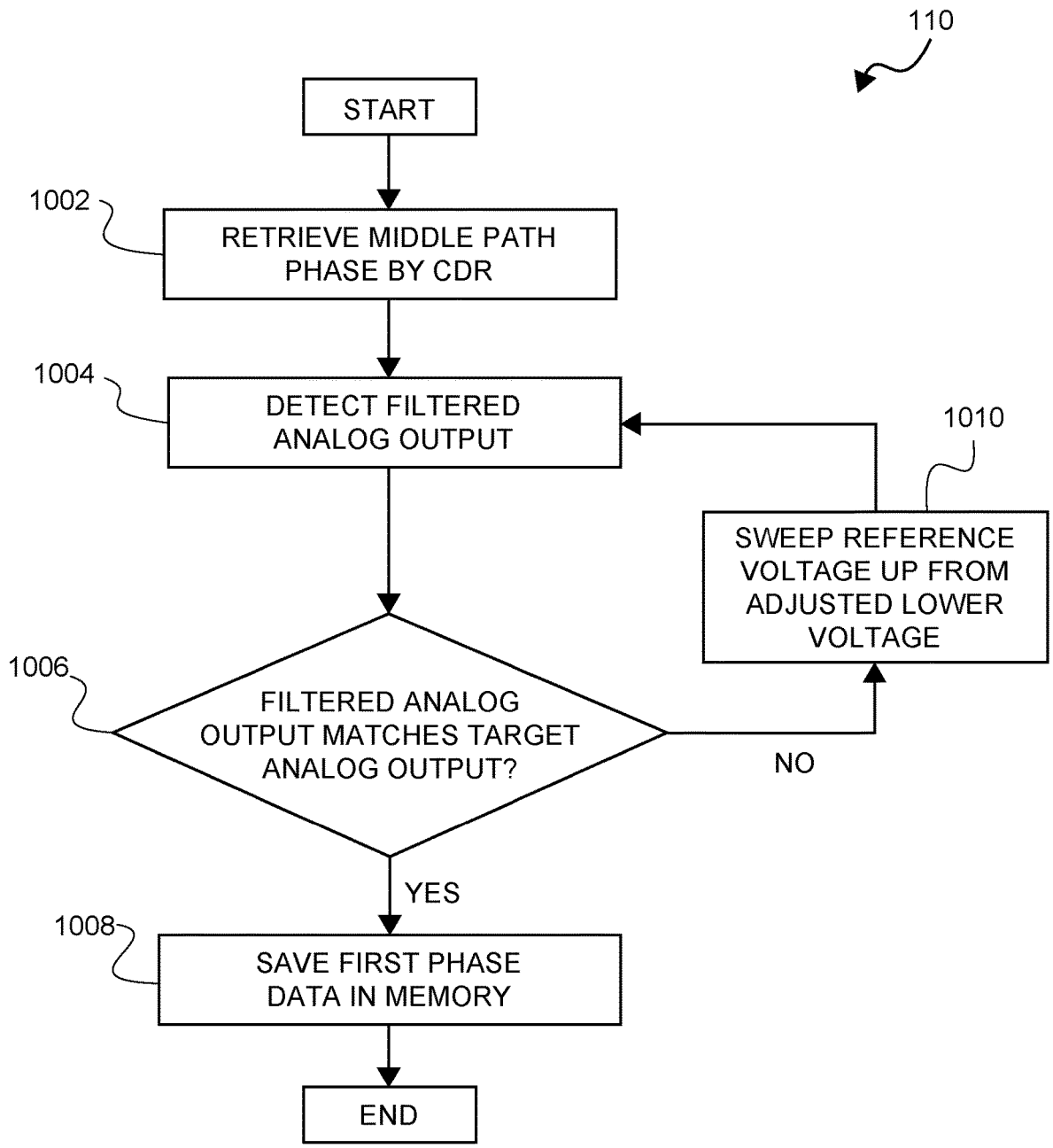
FIG. 10 is a schematic of a method of determining a first phase threshold.

FIG. 10 is a schematic of a method of determining a first phase threshold.

PAM4 signal processor 110 retrieves a middle path phase set by clock data recovery (step 1002).

Clock data recovery data can be transmitted as timing information along with the data streams described herein. In other embodiments, clock data recovery can be calculated at the receiver using the timing information of the data stream.

The phase of the filtered analog output is compared to the phase of a target analog output. PAM4 signal processor 110 determines when the phase of the filtered analog output and the phase of the target analog output match.

Responsive to determining that the phase of the filtered analog output matches the phase of the target analog output ("YES" branch, decision block 1006), PAM4 signal processor 110 saves data associated with a first phase value in memory (step 1008).

PAM4 signal processor 110 is configured to save the data associated with the first phase value in memory to calculate an optimum phase using a second phase value that can be determined using the method described in FIG. 11 below.

In preferred embodiments, calculation of the optimum phase is based on middle path phase creating an output of 0.

In one embodiment, PAM4 signal processor 110 is used to determine a correct v2 and v0 value. The target output is configured to be equal to the reference output. It is further contemplated that PAM4 signal processor 110 can determine whether the target output meets and/or substantially meets the reference output, such as by using a comparator.

In preferred embodiments, PAM4 signal processor 110 calculates the optimum phase by averaging phase_right and phase_left values.

Responsive to determining that the phase of the filtered analog output does not match the phase of the target analog output ("NO" branch, decision block 1006), PAM4 signal processor 110 adjusts the middle path phase (step 1010).

PAM4 signal processor 110 moves the phase from left to right using the adjusted middle path phase (step 1010), and then returns to step 1004 to detect the adjusted filtered analog output (step 1004).

Figure 11:
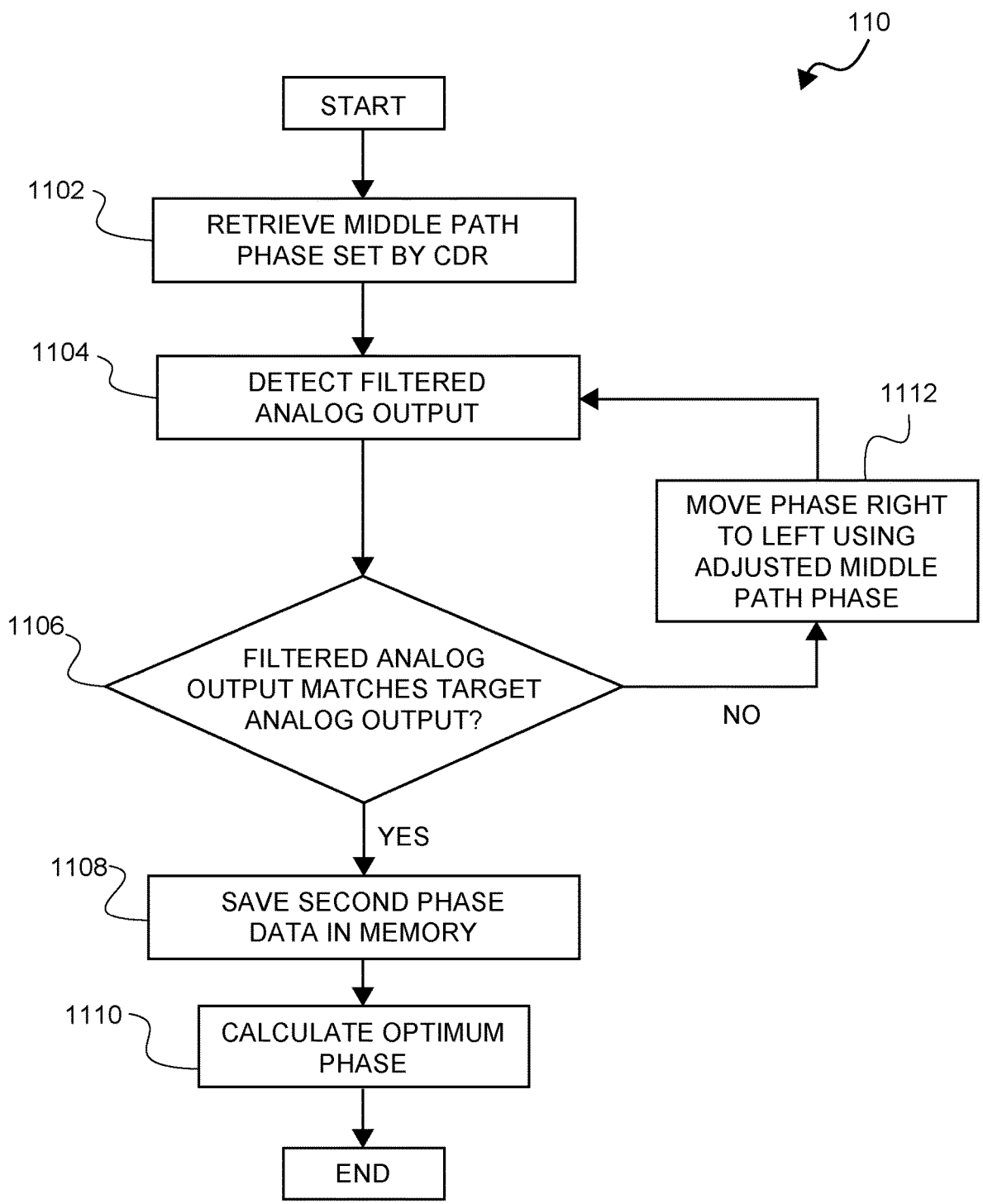
FIG. 11 is a schematic of a method of determining a second phase threshold

FIG. 11 is a schematic of a method of determining a second phase threshold.

PAM4 signal processor 110 retrieves a middle path phase set by clock data recovery (step 1102).

Clock data recovery data can be transmitted as timing information along with the data streams described herein. In other embodiments, clock data recovery can be calculated at the receiver using the timing information of the data stream.

PAM4 signal processor 110 detects a filtered analog output (step 1104).

PAM4 signal processor 110 determines whether the filtered analog output is matches the target analog output (decision block 1106).

The phase of the filtered analog output is compared to the phase of the target analog output. PAM4 signal processor 110 determines when the phase of the filtered analog output and the phase of the target analog output match.

Responsive to determining that the filtered analog output matches the target analog output ("YES" branch, decision block 1106), PAM4 signal processor 110 saves data associated with a second phase value in memory (step 1108) and calculates an optimum phase value (step 1110).

Responsive to determining that the phase of the filtered analog output does not match the phase of the target analog output ("NO" branch, decision block 1110), PAM4 signal processor 110 moves the phase from right to left using the adjusted middle path phase (step 1112), and then returns to step 1104 to detect the adjusted filtered analog output (step 1104).

Figure 12:
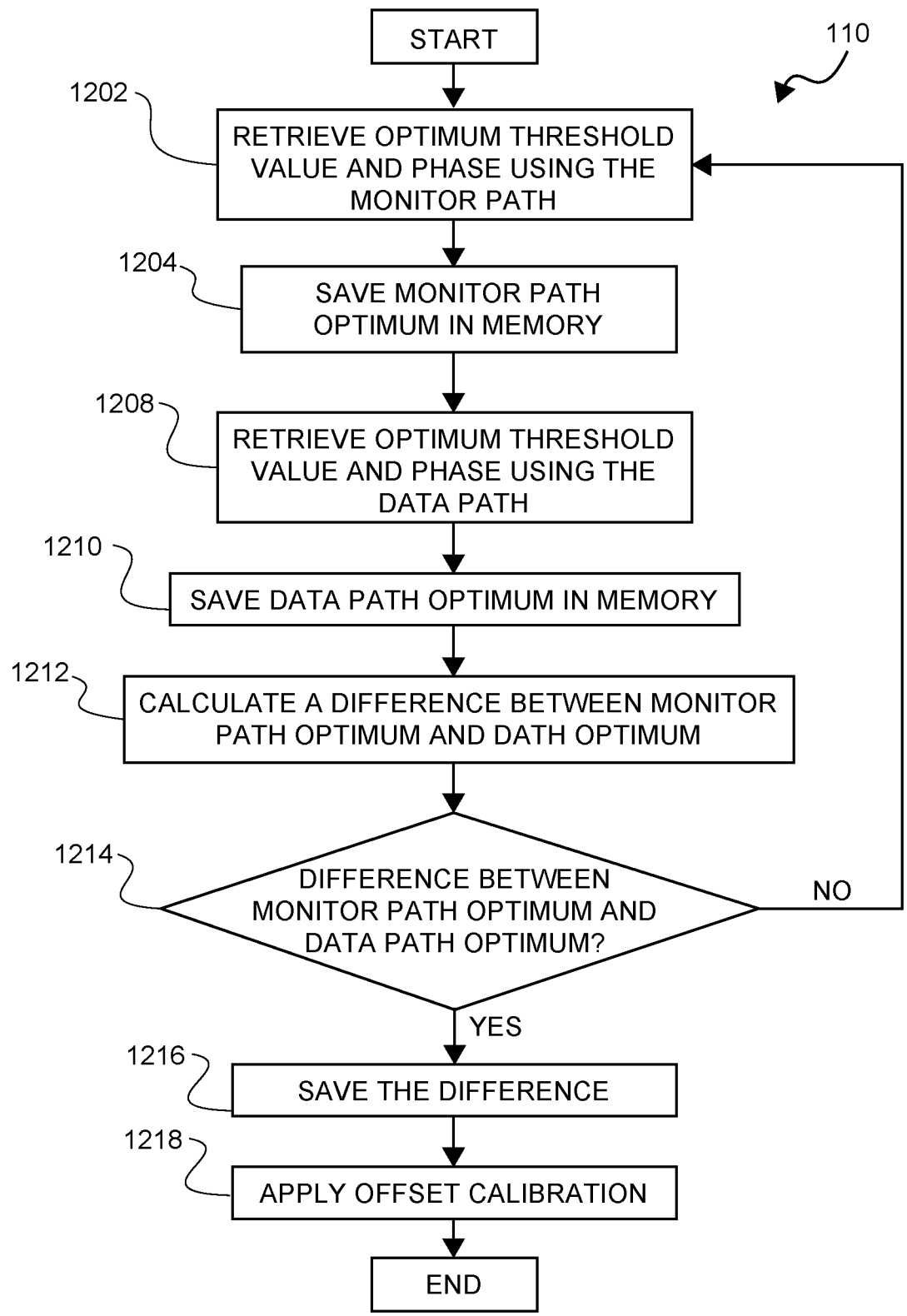
FIG. 12 is a schematic of a method of compensating for the offset by calibrating a monitor path, a top pathway, and a bottom pathway.

FIG. 12 is a schematic of a method of compensating for the offset by calibrating a monitor path, a top pathway, and a bottom pathway.

PAM4 signal processor 110 retrieves an optimum voltage threshold value and an optimum phase value using a monitoring pathway (step 1202).

Conventional systems use the signal input pattern to calculate the output, which can disrupt the flow of data and reduce efficiency of the overall system.

The invention described herein improves upon conventional systems by adapting a PAM4 signal using a separate monitoring pathway. The inventive concept herein contemplates relying on the signal density to reflect 25% for each of the levels. By equally weighting each level, the present invention avoids having a bias, which allows PAM signal processor 110 to slice the incoming PAM4 signal to the correct values. Over time, PAM4 signal processor 110 enables each level of a PAM4 signal to be balanced, which can compensate for drift associated with PAM4 signals caused by compounding variables, such as ISI issues caused by temperature changes in the system.

The present invention retrieves the optimum voltage threshold value from monitoring pathway 602, which determines the amount of positive or negative DC offset compensation to apply to the top and bottom voltage slicing pathways.

The present invention retrieves the optimum phase threshold value from monitoring pathway 602, which determines the amount of phase offset compensation to apply to the top and bottom voltage slicing pathways.

PAM4 signal processor 110 saves the optimum threshold value and the optimum phase value from the monitoring pathway in memory (step 1204).

PAM4 signal processor 110 retrieves the optimum threshold value and the optimum phase value using a data pathway (step 1208). Data pathways can include any means of transmitting and/or receiving data associated with a data architecture.

PAM4 signal processor 110 saves the optimum threshold value from the data pathway in memory (step 1210).

PAM4 signal processor 110 calculates a difference between the monitor pathway optimum threshold value and the data pathway optimum threshold value (step 1212).

PAM4 signal processor determines whether the monitor pathway optimum threshold value and the data pathway optimum threshold value are different values (decision block 1214).

Responsive to determining that the monitor pathway optimum threshold value and the data pathway optimum threshold value are not different values ("NO" branch, decision block 1214), PAM4 signal processor retrieves an optimum voltage threshold value and an optimum phase value using a monitoring pathway (step 1202). In some embodiments, PAM4 signal processor may end operation.

Responsive to determining that the monitor pathway optimum threshold value and the data pathway optimum threshold value are not different values ("YES" branch, decision block 1214), PAM4 signal processor saves a value associated with the difference between the monitor pathway optimum threshold value and the data pathway optimum threshold value (step 1216).

PAM4 signal processor 110 applies an offset calibration to the PAM4 signal (step 1218).

In some embodiments, PAM4 signal processor 110 may end after application of the offset calibrations. In other embodiments, PAM4 signal processor 110 may return to retrieve an optimum voltage threshold value and an optimum phase value using a monitoring pathway (step 1202). However, it is contemplated that PAM4 signal processor 110 can execute any one or more additional steps following calibration and/or return to execute a previously executed step.

In one embodiment, PAM4 signal processor 110 applies DC offset calibration to the top voltage slicing pathway according to the optimum voltage threshold value, such as by increasing or decreasing the input voltage to the top voltage slicing pathway.

In a related embodiment, PAM4 signal processor 110 applies DC offset calibration to the bottom voltage slicing pathway according to the optimum voltage threshold value, such as by increasing or decreasing the input voltage to the bottom voltage slicing pathway.

In some embodiments, PAM4 signal processor 110 can determine whether the voltage and/or phase offsets are successful in reducing bit error rate in any manner known in the art. In some embodiments, PAM4 signal processor 110 compares the accuracy of the output bits to a reference pattern inputted into a voltage slicing pathway.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer-readable storage medium (or media) having computer-readable program instructions thereon for causing a processor to carry out aspects of the present invention.

The computer-readable storage medium can be any tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, a segment, or a portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method to reduce bit error rate in a PAM4 clock data recovery circuit, comprising:
   determining a first target value of a first slicing level;
   sweeping down from an upper voltage threshold to determine a first reference voltage that is lower than the upper voltage threshold;
   detecting a first filtered output associated with the first reference voltage;
   determining whether the first filtered output is higher than the first target value;
   responsive to determining that the first filtered output is higher than the first target value, storing the first reference voltage value;
   sweeping up from a lower voltage threshold to determine a second reference voltage that is higher than the lower voltage threshold;
   detecting a second filtered output associated with the second reference voltage;
   determining whether the second filtered output is lower than a second target value;
   responsive to determining that the second filtered output is lower than the second target value, storing the second reference voltage value; and
   averaging the stored first reference voltage value and the stored second reference voltage value to determine calculated threshold value.

2. The method of claim 1, further comprising determining the upper voltage threshold associated with the first target value of the first slicing level.

* * * * *